(12) United States Patent
Carr

(10) Patent No.: US 7,955,513 B2
(45) Date of Patent: *Jun. 7, 2011

(54) APPARATUS AND METHOD FOR REACTIVE ATOM PLASMA PROCESSING FOR MATERIAL DEPOSITION

(75) Inventor: Jeffrey W. Carr, Livermore, CA (US)

(73) Assignee: Rapt Industries, Inc., Fremont, CA (US)

( * ) Notice: Subject to any disclaimer, the term of this patent is extended or adjusted under 35 U.S.C. 154(b) by 754 days.

This patent is subject to a terminal disclaimer.

(21) Appl. No.: 11/962,012

(22) Filed: Dec. 20, 2007

(65) Prior Publication Data

US 2008/0099441 A1    May 1, 2008

Related U.S. Application Data

(63) Continuation of application No. 10/608,384, filed on Jun. 27, 2003, now Pat. No. 7,311,851, which is a continuation of application No. 10/008,236, filed on Nov. 7, 2001, now Pat. No. 6,660,177.

(51) Int. Cl.
*B44C 1/22* (2006.01)

(52) U.S. Cl. .............. 216/63; 216/58; 216/67; 438/708; 438/710

(58) Field of Classification Search .............. 438/706, 438/710, 712; 216/38, 58, 63, 64, 66, 67, 216/90

See application file for complete search history.

(56) References Cited

U.S. PATENT DOCUMENTS

| | | | |
|---|---|---|---|
| 3,264,508 A | 8/1966 | Lai et al. ................. | 313/231.01 |
| 3,830,428 A | 8/1974 | Dyos | |
| 3,937,866 A | 2/1976 | Sunnen et al. .................. | 373/20 |
| 3,953,704 A | 4/1976 | Bejat et al. ................. | 219/76.16 |
| 4,035,604 A | 7/1977 | Meleka et al. | |
| 4,050,408 A | 9/1977 | Beucherie .................... | 118/49.1 |
| 4,306,175 A | 12/1981 | Schleicher ............... | 315/111.21 |
| 4,339,326 A | 7/1982 | Hirose .................... | 204/298.38 |

(Continued)

FOREIGN PATENT DOCUMENTS

DE  199 25 790 A1  12/2000

(Continued)

OTHER PUBLICATIONS

Supplementary European Search Report, EP Application No. 02706029.2 mailed Mar. 5, 2008, 4 pages.

(Continued)

*Primary Examiner* — Lan Vinh

(74) *Attorney, Agent, or Firm* — Fliesler Meyer LLP

(57) ABSTRACT

A method for shaping a surface of a workpiece, comprises positioning at least one of a workpiece and an inductively-coupled plasma (ICP) torch including three concentrically arranged tubes. A plasma gas is introduced to an outer tube of the ICP torch and energy is transferred from a radio frequency (RF) power source to the plasma gas to generate an excitation zone at least partially downstream of the ICP torch. A reactive reactive precursor is introduced to the excitation zone, and an auxiliary gas is introduced to the intermediate tube to control a position of the excitation zone relative to the ICP torch so that a controlled distribution of reactive species is formed. The surface is shaped by removing material from the surface of the workpiece with at least a portion of the reactive species and adding material to the surface of the workpiece with at least a portion of the reactive species.

15 Claims, 6 Drawing Sheets

U.S. PATENT DOCUMENTS

| | | | | |
|---|---|---|---|---|
| 4,431,898 A | 2/1984 | Reinberg | | 219/121 PG |
| 4,431,901 A | 2/1984 | Hull | | 219/121 PR |
| 4,439,463 A | 3/1984 | Miller | | 427/563 |
| 4,440,556 A | 4/1984 | Oh et al. | | 65/391 |
| 4,440,558 A | 4/1984 | Nath et al. | | 65/391 |
| 4,532,199 A | 7/1985 | Ueno | | 430/128 |
| 4,668,366 A | 5/1987 | Zarowin | | 204/192.1 |
| 4,674,683 A | 6/1987 | Fabel | | 239/13 |
| 4,689,467 A | 8/1987 | Inoue | | 219/121.6 |
| 4,739,147 A | 4/1988 | Meyer et al. | | 219/121.48 |
| 4,771,015 A | 9/1988 | Kanai et al. | | 427/574 |
| 4,863,501 A | 9/1989 | Mansfield | | 65/391 |
| 4,897,282 A | 1/1990 | Kniseley et al. | | 427/446 |
| 4,908,492 A | 3/1990 | Okamoto et al. | | 219/121.52 |
| 4,924,061 A | 5/1990 | Labat et al. | | 219/121.52 |
| 4,958,767 A | 9/1990 | Labrot et al. | | 219/121.48 |
| 5,000,771 A * | 3/1991 | Fleming et al. | | 65/391 |
| 5,007,771 A | 4/1991 | Fu et al. | | 405/128.75 |
| 5,095,189 A | 3/1992 | Frind et al. | | 219/121.47 |
| 5,106,827 A | 4/1992 | Borden | | 505/1 |
| 5,144,151 A | 9/1992 | Thorne et al. | | 250/559.42 |
| 5,200,595 A | 4/1993 | Boulos | | 219/121.52 |
| 5,206,471 A | 4/1993 | Smith | | 219/687 |
| 5,238,532 A | 8/1993 | Zarowin | | 156/643 |
| 5,254,830 A | 10/1993 | Zarowin | | 219/121.43 |
| 5,256,205 A | 10/1993 | Schmitt | | 118/723 |
| 5,280,154 A | 1/1994 | Cuomo | | 219/121.52 |
| 5,290,382 A | 3/1994 | Zarowin | | 156/345 |
| 5,291,415 A | 3/1994 | Zarowin | | 364/474.3 |
| 5,292,400 A | 3/1994 | Mumola | | 156/643 |
| 5,298,103 A | 3/1994 | Steinberg | | 156/345 |
| 5,298,714 A | 3/1994 | Szente et al. | | 219/121.48 |
| 5,302,237 A | 4/1994 | Larson et al. | | 156/643 |
| 5,321,224 A | 6/1994 | Kamimura et al. | | 219/76.15 |
| 5,336,355 A | 8/1994 | Zarowin | | 156/345 |
| 5,344,524 A | 9/1994 | Sharma | | 156/630 |
| 5,346,578 A | 9/1994 | Benzing | | 156/345 |
| 5,349,154 A | 9/1994 | Harker et al. | | 117/102 |
| 5,356,674 A | 10/1994 | Henne et al. | | 427/449 |
| 5,364,434 A | 11/1994 | Sanghera et al. | | 65/30.1 |
| 5,364,496 A | 11/1994 | Bollinger | | 156/643 |
| 5,372,674 A | 12/1994 | Steinberg | | 156/643 |
| 5,375,064 A | 12/1994 | Bollinger | | 364/474.3 |
| 5,376,224 A | 12/1994 | Zarowin | | 156/643 |
| 5,386,119 A | 1/1995 | Ledger | | 250/341.1 |
| 5,405,480 A | 4/1995 | Benzing | | 156/345 |
| 5,419,803 A | 5/1995 | Mumola | | 216/38 |
| 5,429,730 A | 7/1995 | Nakamura et al. | | 204/192.34 |
| 5,430,355 A | 7/1995 | Paranjpe | | 315/111.41 |
| 5,468,955 A | 11/1995 | Chen et al. | | 250/251 |
| 5,474,642 A | 12/1995 | Zorina et al. | | 156/345.24 |
| 5,503,677 A | 4/1996 | Morsen et al. | | 118/723 R |
| 5,563,709 A | 10/1996 | Poultney | | 356/371 |
| 5,591,068 A | 1/1997 | Taylor | | 451/104 |
| 5,629,054 A | 5/1997 | Kanai | | 427/575 |
| 5,639,699 A | 6/1997 | Nakamura et al. | | 427/527 |
| 5,650,032 A | 7/1997 | Keller | | 156/345 |
| 5,676,863 A | 10/1997 | Jouvenel | | 219/121.52 |
| 5,680,382 A | 10/1997 | Inoue | | 369/53.2 |
| 5,683,548 A | 11/1997 | Hartig | | 156/643.1 |
| 5,688,415 A | 11/1997 | Bollinger | | 219/121.41 |
| 5,767,627 A | 6/1998 | Siniaguine | | 315/111.41 |
| 5,795,493 A | 8/1998 | Bukhman | | 216/59 |
| 5,811,021 A | 9/1998 | Zarowin | | 216/67 |
| 5,811,022 A | 9/1998 | Savas | | 216/68 |
| 5,820,940 A | 10/1998 | Gorynin et al. | | 427/455 |
| 5,863,829 A | 1/1999 | Nakayoshi | | 438/459 |
| 5,877,471 A | 3/1999 | Huhn | | 219/121.49 |
| 5,897,712 A | 4/1999 | Hanawa | | 216/68 |
| 5,916,455 A | 6/1999 | Kumagai | | 216/68 |
| 5,925,266 A | 7/1999 | Gange | | 219/121.48 |
| 5,932,293 A | 8/1999 | Belashchenko et al. | | |
| 5,942,445 A | 8/1999 | Kato | | 438/691 |
| 5,944,902 A | 8/1999 | Redeker | | 118/723 AN |
| 5,955,383 A | 9/1999 | Hwang | | 438/729 |
| 5,961,772 A | 10/1999 | Selwyn | | 156/345 |
| 5,965,034 A | 10/1999 | Vinogradov | | 216/68 |
| 5,981,392 A | 11/1999 | Oishi | | 438/691 |
| 5,998,757 A | 12/1999 | Schneider | | 219/121.54 |
| 6,004,866 A | 12/1999 | Nakano | | 438/459 |
| 6,017,221 A | 1/2000 | Flamm | | 437/225 |
| 6,028,286 A | 2/2000 | Wicker | | 219/121.53 |
| 6,030,489 A | 2/2000 | Hwang | | 156/345 |
| 6,040,548 A | 3/2000 | Siniaguine | | 219/121.48 |
| 6,041,623 A * | 3/2000 | Fleming, Jr. | | 65/391 |
| 6,056,848 A | 5/2000 | Daviet | | 156/345 |
| 6,068,784 A | 5/2000 | Collins | | 216/68 |
| 6,073,578 A | 6/2000 | Shim | | 118/723 I |
| 6,074,947 A | 6/2000 | Mumola | | 438/689 |
| 6,085,688 A | 7/2000 | Lymberopoulos | | 118/723 I |
| 6,093,655 A | 7/2000 | Donohoe | | 438/717 |
| 6,105,534 A | 8/2000 | Siniaguine | | 118/723 EB |
| 6,139,678 A | 10/2000 | Siniaguine | | 156/345 |
| 6,143,129 A | 11/2000 | Savas | | 156/345 |
| 6,153,852 A | 11/2000 | Blutke | | 219/121.59 |
| 6,159,388 A | 12/2000 | Yanagisawa et al. | | 216/60 |
| 6,170,428 B1 | 1/2001 | Redeker | | 118/723 I |
| 6,194,036 B1 | 2/2001 | Babayan | | 427/563 |
| 6,200,908 B1 | 3/2001 | Vandamme | | 438/719 |
| 6,203,661 B1 | 3/2001 | Siniaguine | | 156/345 |
| 6,207,924 B1 | 3/2001 | Trassy | | 219/121.52 |
| 6,209,480 B1 | 4/2001 | Moslehi | | 118/723 I |
| 6,214,161 B1 | 4/2001 | Becker | | 156/345 |
| 6,218,640 B1 | 4/2001 | Selitser | | 219/121.52 |
| 6,221,268 B1 | 4/2001 | Li et al. | | 216/67 |
| 6,228,330 B1 | 5/2001 | Herrmann | | 422/186.05 |
| 6,229,111 B1 | 5/2001 | McCay et al. | | 219/121.59 |
| 6,238,587 B1 | 5/2001 | Siniaguine | | 216/59 |
| 6,239,004 B1 | 5/2001 | Aga | | 438/455 |
| 6,239,553 B1 | 5/2001 | Barnes | | 315/111.51 |
| 6,245,202 B1 | 6/2001 | Edamura | | 204/298.06 |
| 6,262,523 B1 | 7/2001 | Selwyn et al. | | 313/231.31 |
| 6,284,668 B1 | 9/2001 | Imahashi | | 438/716 |
| 6,312,554 B1 | 11/2001 | Ye | | 156/345.38 |
| 6,388,225 B1 | 5/2002 | Blum et al. | | 219/121.48 |
| 6,406,590 B1 | 6/2002 | Ebata et al. | | 156/345.43 |
| 6,417,028 B2 | 7/2002 | Wensel | | 438/112 |
| 6,424,091 B1 | 7/2002 | Sawada et al. | | 315/111.81 |
| 6,482,476 B1 | 11/2002 | Liu | | 427/535 |
| 6,491,978 B1 | 12/2002 | Kalyanam | | 427/255.394 |
| 6,534,921 B1 | 3/2003 | Seo et al. | | 315/111.51 |
| 6,551,860 B2 | 4/2003 | Uner et al. | | 438/115 |
| 6,660,177 B2 | 12/2003 | Carr | | 216/63 |
| 6,663,231 B2 | 12/2003 | Lee et al. | | 347/68 |
| 6,683,272 B2 | 1/2004 | Hammer et al. | | 219/121.48 |
| 6,821,500 B2 | 11/2004 | Fincke et al. | | 423/650 |
| 7,297,892 B2 | 11/2007 | Kelley et al. | | 219/121.42 |
| 7,304,263 B2 | 12/2007 | Chang et al. | | 219/121.41 |
| 2001/0052257 A1 | 12/2001 | Magerle | | |
| 2002/0037374 A1 | 3/2002 | Gherardi et al. | | |
| 2002/0038689 A1 | 4/2002 | Bayer et al. | | |
| 2002/0058143 A1 | 5/2002 | Hunt et al. | | |
| 2002/0100751 A1 | 8/2002 | Carr | | |
| 2002/0148560 A1 | 10/2002 | Carr | | |
| 2002/0177003 A1 | 11/2002 | Myrick | | |
| 2003/0021746 A1 | 1/2003 | Fincke et al. | | |
| 2003/0113479 A1 | 6/2003 | Fukuda et al. | | |
| 2003/0230112 A1 | 12/2003 | Ikeda et al. | | |
| 2004/0115936 A1 | 6/2004 | DePetrillo et al. | | |
| 2004/0118348 A1 | 6/2004 | Mills | | |
| 2004/0137745 A1* | 7/2004 | Houghton et al. | | 438/706 |
| 2004/0173316 A1 | 9/2004 | Carr | | |
| 2004/0173579 A1 | 9/2004 | Carr | | |
| 2004/0173580 A1 | 9/2004 | Carr | | |
| 2005/0000656 A1 | 1/2005 | Carr | | |
| 2005/0018199 A1 | 1/2005 | LeBlanc | | |
| 2005/0061774 A1 | 3/2005 | Kelley et al. | | |
| 2005/0118348 A1 | 6/2005 | Kasma et al. | | |
| 2005/0184034 A1 | 8/2005 | Carr | | |
| 2008/0029485 A1 | 2/2008 | Kelley et al. | | |
| 2008/0035612 A1 | 2/2008 | Chang et al. | | |
| 2008/0083425 A1 | 4/2008 | Carr | | |

FOREIGN PATENT DOCUMENTS

| | | |
|---|---|---|
| EP | 0 284 436 A2 | 9/1988 |
| EP | 0 546 842 A1 | 6/1993 |
| JP | 50-153024 | 12/1975 |

| | | |
|---|---|---|
| JP | 63-289798 | 11/1988 |
| JP | 01-96040 A | 4/1989 |
| JP | 05-135896 A | 6/1993 |
| JP | 09-069397 | 3/1997 |
| JP | 09-115865 | 5/1997 |
| JP | 10-298318 A | 11/1998 |
| JP | 2000-173994 A | 6/2000 |
| JP | 2000-174004 | 6/2000 |
| JP | 2000-183044 A | 6/2000 |
| JP | 2002-170815 | 6/2002 |
| WO | WO 97/45856 | 12/1997 |
| WO | WO 02/061171 A1 | 8/2002 |
| WO | WO 02/062111 A2 | 8/2002 |

OTHER PUBLICATIONS

Supplementary European Search Report, EP Application No. 02706044.1 mailed Mar. 7, 2008, 4 pages.

Bollinger, et al., "Rapid, Non-Contact Optical Figuring of Aspheric Surfaces with Plasma Assisted Chemical Etching (PACE)," 1990, SPIE vol. 1333, Advanced Optical Manufacturing and Testing, pp. 44-57.

Kulikovsky, Andrei A., "Production of Chemically Active Species in the Air by a Single Positive Streamer in a Nonuniform Field," IEEE Transactions on Plasma Science, vol. 25, No. 3, pp. 439-446, Jun. 1997.

Takino, et al., "Computer Numerically Controlled Plasma Chemical Vaporization Machining with a Pipe Electrode for Optical Fabrication," Applied Optics, vol. 37, No. 22, pp. 5198-5210, Aug. 1, 1998.

Zarowin, C.B., et al., "Rapid, Non-Contact, Damage Free Shaping of Optical & Other Surfaces with Plasma Assisted Chemical Etching," $43^{rd}$ Annual Symposium on Frequency Control, ©1989, IEEE, pp. 623-626.

International Search Report, PCT, for International Application No. PCT/US04/06773, mailed Oct. 31, 2005, 3 pages.

Supplementary European Search Report, EP Application No. 02706064.9 mailed Dec. 21, 2006, 4 pages.

* cited by examiner

APPARATUS AND METHOD FOR REACTIVE ATOM PLASMA PROCESSING FOR MATERIAL DEPOSITION

CLAIM OF PRIORITY

This application is a continuation of U.S. application Ser. No. 10/608,384, entitled APPARATUS AND METHOD FOR REACTIVE ATOM PLASMA PROCESSING FOR MATERIAL DEPOSITION, filed Jun. 27, 2003, U.S. Pat. No. 7,311,851, issue date Dec. 25, 2007, which is a continuation of U.S. application Ser. No. 10/008,236, entitled APPARATUS AND METHOD FOR REACTIVE ATOM PLASMA PROCESSING FOR MATERIAL DEPOSITION, filed Nov. 7, 2001, U.S. Pat. No. 6,660,177, issued Dec. 9, 2003, both of which are incorporated herein by reference.

FIELD OF INVENTION

The field of the invention relates to shaping surfaces using a gas plasma.

BACKGROUND

Modern materials present a number of formidable challenges to the fabricators of a wide range of optical, semiconductor, and electronic components, many of which require precision shaping, smoothing, and polishing. Current methods, such as conventional grinding and polishing, have a number of disadvantages. Physical contact methods, such as grinding, abrasive polishing, diamond turning and ion milling, involve physical force at the microscopic scale and can create damage in the subsurface of the material being treated. Physical contact methods also have a trade-off between speed and quality. Smooth surfaces can require the use of very slow material removal rates, while hard materials such as silicon carbide can be extremely difficult to polish. Soft or delicate structures can also be difficult to polish, as the physical force involved can crack or bend the structures. Some materials such as glass can also end up with a surface layer of redeposited material, which can affect the properties and behavior of the manufactured component.

Damage-Free Laser Optics

In one example of such a manufacturing challenge, optics produced with current or prior art polishing methods cannot withstand the high intensity of light produced by high-powered laser systems. One of the engineering challenges in such an advanced system is the need for a large number of defect-free optics to be produced within an acceptable period of time and at an acceptable cost. Subsurface defects in such an optic can cause cracks to form on the rear surface of lenses exposed to high ultraviolet laser light levels. These cracks can grow until a large fraction of the light is obscured or until the lens fractures. Some of these lenses also serve as a vacuum barrier, making catastrophic failure a serious safety concern.

Conventional abrasives-based polishing can be used for many materials. This polishing process is both chemical and mechanical, involving surface and solution chemistry as well as mechanical abrasion. Mechanical abrasion rapidly removes material, but can produce sub-surface damage and cause the damage to propagate deeper into the workpiece. The chemical portion dissolves and redeposits glass, forming a relatively smooth surface. The chemical kinetics of redeposition favor the formation of smooth surfaces, as high spots are mechanically abraded away while holes are filled through redeposition.

This process of redeposition can lead to problems in some applications. Analysis of the redeposition layer reveals a tremendous number of contaminants, mostly from the abrasive but also from previous polishing steps. This redeposition layer can affect the adhesion and physical properties of optical coatings. Below this redeposition zone can be an underlying zone of damaged glass, up to tens of microns thick or more. When high fluxes of light pass through this zone, damage sites can nucleate and grow, eventually leading to failure of the entire optic. The quality of the polish, and the underlying redeposition layer and subsurface damage, ultimately control how much light can be transmitted through the optics.

In order to produce optics capable of routinely withstanding laser intensities as high as 12 J/cm2, a process is required to remove the 20-30 microns of damaged material. Conventional polishing can be used to remove this damage layer, but it must be done very slowly—on the order of about 0.1 pm per hour. Polishing for this length of time also necessitates periodic checks of the shape of the part using precision metrology.

Wet Etching

Another approach to removing the damage layer in an optic is a wet chemical etch. In such a process, only a limited amount of material can be removed before the surface becomes excessively pitted, with a resulting increase in the amount of light scattered by the optic. Optics processed by wet etch have been tested, with the disappointing result that the damage threshold was unaffected.

Ion Milling

Another approach utilizes ion milling after conventional polishing. Ion milling is a well-established technique for removing small amounts of material from a surface using a kinetic beam of ions. Some advantages of ion milling include: no surface contact, no weight on the optic, no edge effects, and correction of long spatial wavelength errors.

There are numerous disadvantages to ion milling, however, including high surface temperatures, an increase in surface roughness, and the need for vacuum. The temperature is dependant on beam current, so that an increase in etch rate produces an increase in temperature often surpasses several hundred ° C. Nearly all heat must be removed through the chuck, usually requiring a good thermal connection between the workpiece and the holder. This is difficult when working on transmission optics because they must be held by the edges so as not to damage the polished surface. Further, ion beams cannot smooth surfaces. For small amounts of material removal, roughness can be held constant. Large amounts of material removal cause an unfortunate increase in roughness.

Reduced Pressure Plasma Methods

Another approach involves plasma etching at reduced temperature, which is used extensively in the semiconductor industry for processing of a wide variety of materials including semiconductors, metals and glasses. Reactive ions are believed to be responsible for the majority of material removal, leading the technique to be known as reactive ion etch (RIE). Considerable effort has been put into developing plasmas with uniform etch rates over the entire discharge, making RIE unsuitable for the production of figured precision components. The greatest practical drawback to RIE for precision finishing of optical components is the need for vacuum and a low material removal rate. Translating either the source or workpiece with precision on a complicated path inside a vacuum chamber is challenging, especially in the case of large optics. In-situ metrology would also be awkward.

A modified RIE for polishing at reduced pressure has been built using a capacitively coupled discharge. Named "Plasma Assisted Chemical Machining" (PACE), the system has been successful in shaping and polishing fused silica. While the parts polished by PACE have shown no evidence of subsurface damage or surface contamination, it has been found that greater sub-surface damage present before etching resulted in an increased roughness after etching.

A major limitation of this capacitively-coupled discharge approach is the requirement that the workpiece be either conductive or less than 10 mm thick. In addition, etch rates are dependant on part thickness, decreasing by a factor of ten when thickness changed from 2 to 10 mm. Above 10 mm the rates are too low to be of much use. If metrology is needed in an iterative procedure, the chamber must be vented and pumped down for the next etch step. The convergence rate for PACE is also typically very low, resulting in a long, expensive multi-step process. PACE technology was recently improved by the substitution of a microwave plasma source for the capacitively coupled system, but the rates are still too slow for optics manufacturing.

Atmospheric Pressure Plasma Methods

In yet another approach, a direct current (DC) plasma can be used at atmospheric pressure to thin wafers. Originally called a "Plasma Jet" and also referred to as Atmospheric Downstream Plasma (ADP), such a system uses argon as the plasma gas, with a trace amount of fluorine or chlorine for reactive atom production. The main intent of the device is to do backside thinning of processed silicon wafers for smart card and other consumer applications. With the ADP tool, wafers are thinned in a batch mode by placing them on a platten and using planetary type motion to move the sub-aperture plasma in a pseudo-random fashion across the surface.

Unfortunately, atmospheric DC plasma jets such as ADP are not well suited for the precise shaping and smoothing of surfaces or for material deposition. Because the reactive gas is mixed with the bulk gas prior to excitation, the reactive species in the plasma are widely distributed across the discharge. This substantially increases the footprint and the minimum feature size that can be etched into a surface. Furthermore, the electrodes that are used to establish the arc are eroded by the reactants. This adds particulates to the gas stream, as well as causing fluctuations in plasma conditions, and accounting for the reduced uniformity compared to RIE systems. Detrimental electrode reactions also preclude the use of oxygen and many other plasma gases.

Another plasma process, known as Chemical Vapor Machining (CVM), is a radio frequency (RF) plasma process that has been used to slice silicon. This plasma is generated around a wire or blade electrode immersed in a noble gas atmosphere containing a trace of reactive components. Like the PACE process it closely resembles, material removal through CVM is entirely chemical in nature. The damage for CVM and wet chemical etching are similar, close to the intrinsic damage typically found in silicon used in the semiconductor industry.

Several performance characteristics limit the applications of CVM. First, the non-rotationally symmetric nature of the footprint makes the process difficult to model and control. Process rates are limited by the rate at which the plasma converts the reactive precursor gas into radical atoms. The device is difficult to scale up, limiting the maximum removal rate and the practical limit for fine-scale material removal. While no vacuum is required for CVM, the workpiece must be enclosed in a vessel to contain the plasma atmosphere.

Another type of plasma jet has been developed to etch and deposit material on surfaces as well as to clean surfaces, known as an "ApJet." This system consists of two concentric electrodes that generate a DC plasma which exits through a nozzle. The discharge is at a low temperature, making the process suitable for cleaning temperature-sensitive materials. The ApJet is not suitable for precisely shaping and polishing surfaces, as etch rates are low and the electrodes and nozzle erode and deposit material onto the surface. This makes precision control difficult. Furthermore, the ApJet cannot smooth rough surfaces.

BRIEF SUMMARY

Systems and methods in accordance with the present invention overcome deficiencies and obstacles in the prior art to produce a highly-controllable, precise, atmospheric, non-contact material removal process. These systems and methods also provide improved processes for shaping geometric surfaces and rapidly shaping hard-to-machine materials, as well as rapidly thinning finished silicon devices with high smoothness and minimal thickness variation.

One method for shaping a surface of a workpiece involves placing the workpiece in a plasma processing chamber that includes a plasma torch, such as an ICP torch. The workpiece and plasma torch are moved with respect to each other, whether by translating and/or rotating the workpiece, the plasma, or both. Reactive atom plasma processing is used to shape the surface of the workpiece with the discharge from the plasma torch. Reactive atom plasma processing can also be used for purposes such as to planarize, polish, clean, or thin the workpiece. The plasma process can also be used to deposit additional material onto the surface of a workpiece. The processing may cause minimal or no damage to the workpiece underneath the surface, and may involve removing material from the surface of the workpiece.

Also included in the present invention are tools and systems for accomplishing these and other methods. Such a system for shaping the surface of a workpiece can involve a plasma torch configured to shape the surface of a workpiece using a reactive plasma process. A translator can be used to translate the workpiece, the torch, or both, such that the desired shape, planarization, polishing, deposition, or cleaning is achieved. The torch can be contained in a plasma processing or other appropriate chamber.

DETAILED DESCRIPTION

Systems and methods in accordance with the present invention have advantages over prior art systems, such as PACE and chemical vapor machining, in that the number of potential products increases to include devices fabricated from heat sensitive components and heterogeneous materials that are typically difficult to polish by chemical means. Polishing and planarization are now be possible with little heat gain and minimal material removal.

Figure 1:
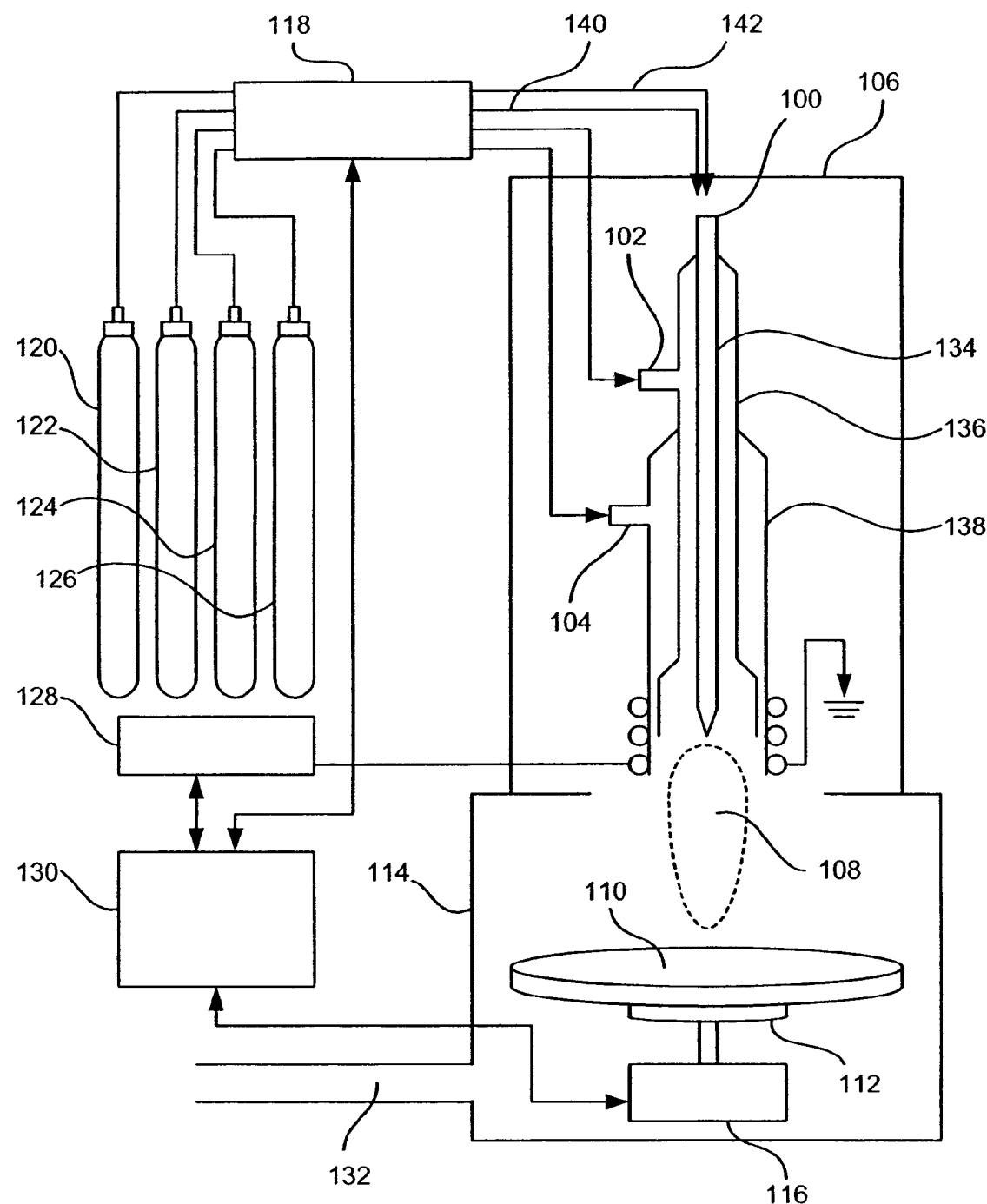
FIG. 1 is a diagram of a system in accordance with one embodiment of the present invention.

FIG. 1 shows one embodiment of a reactive atom plasma (RAP) system that can be used in accordance with the present invention. FIG. 1 shows an ICP torch in a plasma box 106. The torch consists of an inner tube 134, an outer tube 138, and an intermediate tube 136. The inner tube 134 has a gas inlet 100 for receiving a stream of reactive precursor gas 142 from the mass flow controller 118. The gas inlet 100 can also be used for receiving a depositional precursor gas stream 140, or a material to be deposited on the surface of a workpiece. The intermediate tube 136 has a gas inlet 102 for receiving an auxiliary gas from the flow controller 118. The outer tube 138 has a gas inlet 104 for receiving a plasma gas from the mass flow controller 118. The mass flow controller 118 receives the necessary gasses from a number of gas supplies 120, 122, 124, 126, and controls the amount and rate of gasses passed to the respective tube of the ICP torch. The ICP torch generates a plasma discharge 108, which can be used to, for example, shape or polish a workpiece 110 located on a chuck 112 in the workpiece box 114. In this embodiment, the plasma box 106 and workpiece box 114 are separate, allowing the plasma discharge 108 and/or torch to pass at least partially between the plasma 106 box and the workpiece box 114. The workpiece box 114 has an exhaust 132 for carrying away any process gases or products resulting from, for example, the interaction of the plasma discharge 108 and the workpiece 110. In other embodiments, there may not be separate boxes for the plasma torch and the workpiece.

The chuck 112 in this embodiment is in communication with a translation stage 116, which is adapted to translate and/or rotate a workpiece 110 on the chuck 112 with respect to the plasma discharge 108. The translation stage 116 is in communication with a computer control system 130, such as may be programmed to provide the necessary information or control to the translation stage 116 to allow the workpiece 110 to be moved along a proper path to achieve a desired shaping or polishing of the workpiece. The computer control system 130 is in communication with an RF power supply 128, which supplies power to the ICP torch. The computer control system 130 also provides the necessary information to the mass flow controller 118.

Figure 2:
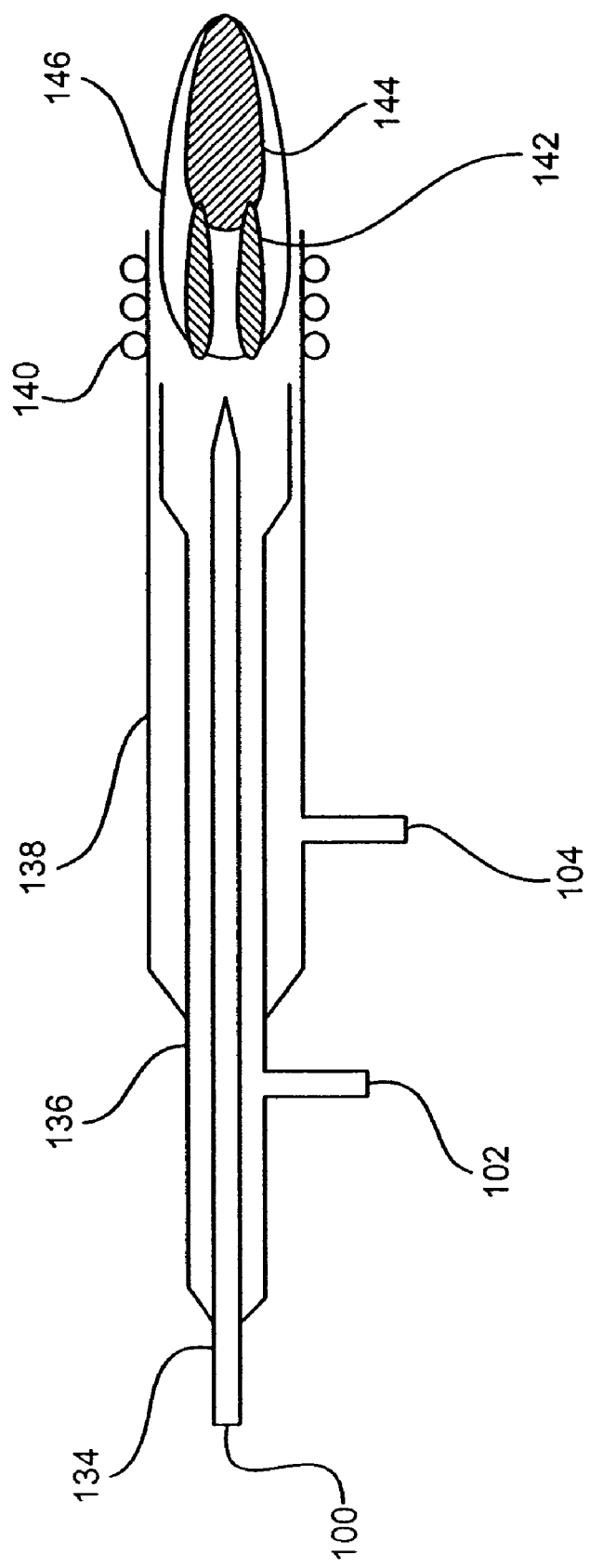
FIG. 2 is a diagram of the ICP torch of FIG. 1.

The torch itself can be seen in greater detail in FIG. 2. An induction coil 140 surrounds the outer tube 138 of the torch near the plasma discharge 144. Current from the RF power supply flows through the coil 140 around the end of the torch. This energy is coupled into the plasma. Also shown are the excitation zones 142, into which the reactive precursor is injected, and the plasma envelop 146, which can be for example a sheath of argon gas.

Figure 5:
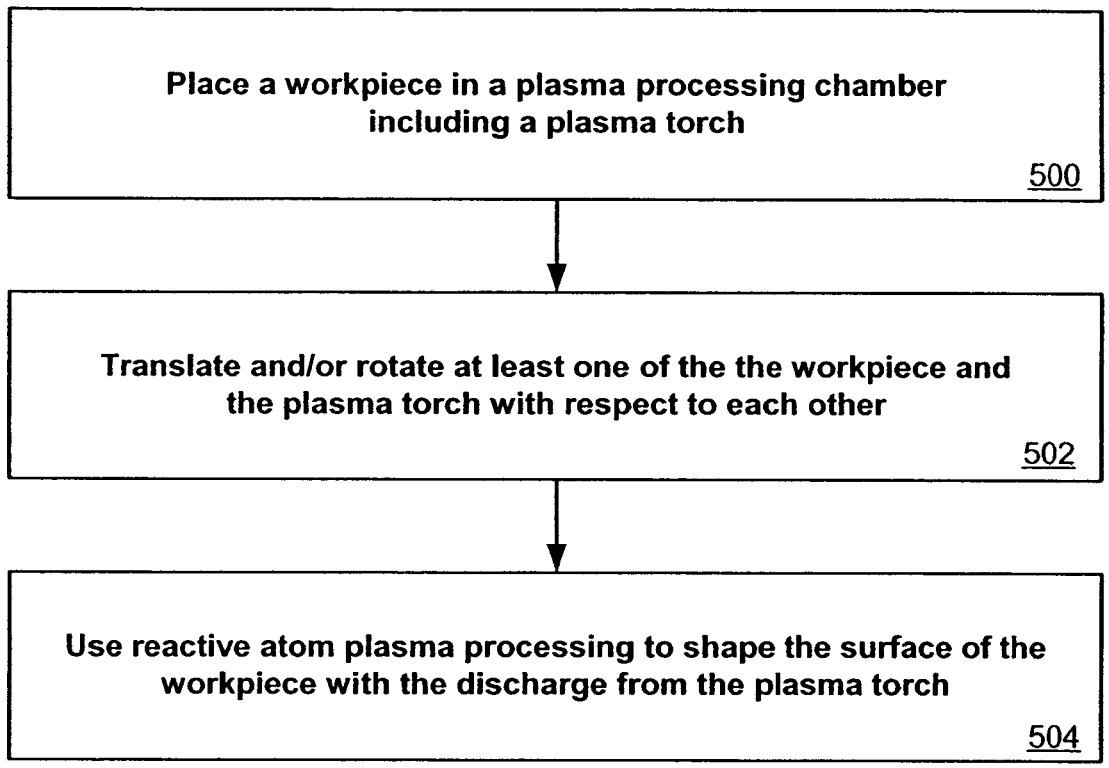
FIG. 5 is a flowchart showing a process in accordance with one embodiment of the present invention.

One method for using such a system is shown in FIG. 5. In this method, a workpiece is placed in a plasma processing chamber that includes a plasma torch 500. At least one of the workpiece and the plasma torch is translated and/or rotated, such as by translating the workpiece with respect to the torch 502. Reactive atom plasma processing is then used to shape the surface of the workpiece with the discharge from the plasma torch 504.

Figure 6:
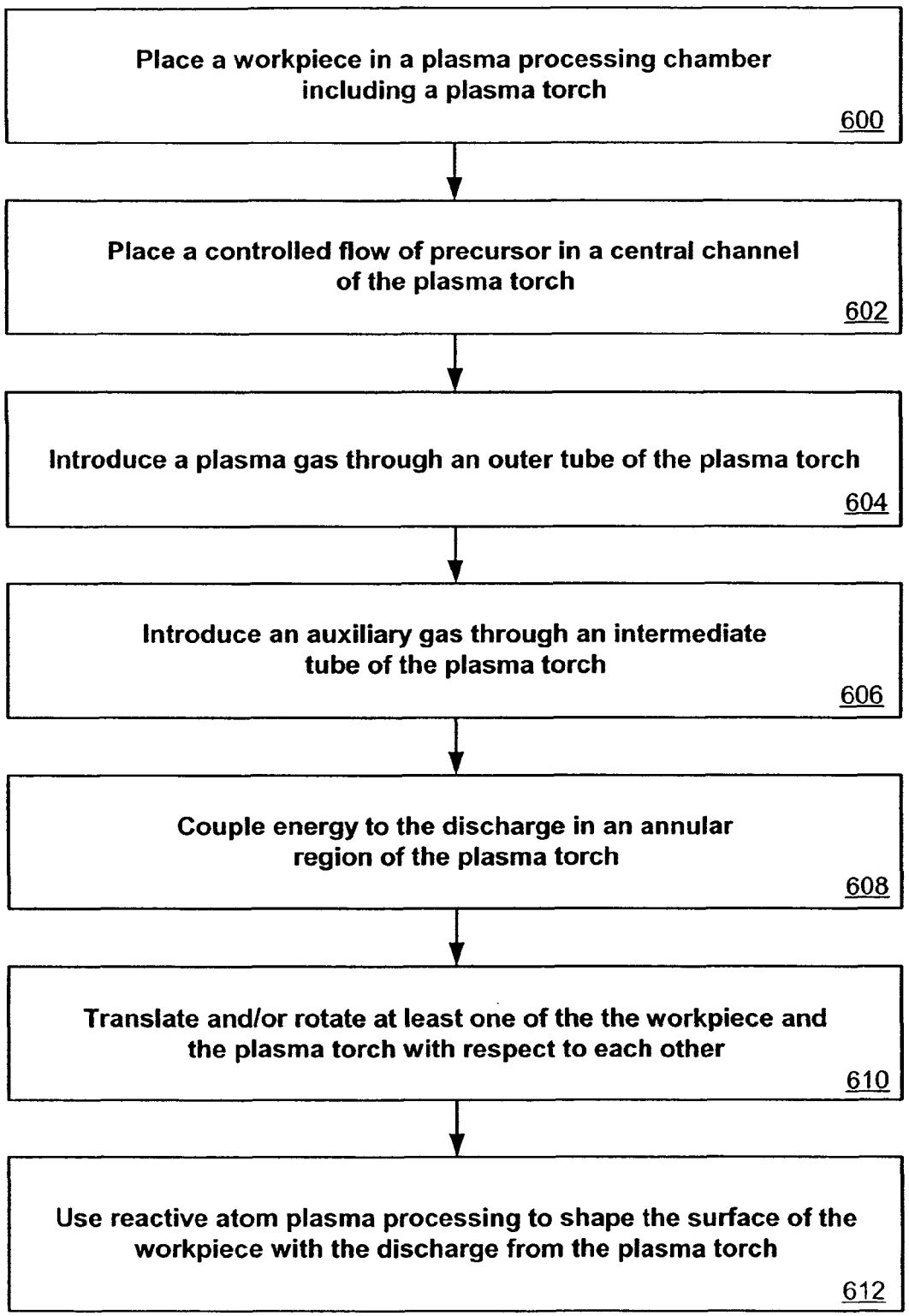
FIG. 6 is a flowchart showing another process in accordance with one embodiment of the present invention.

In another method, shown in FIG. 6, the workpiece is again placed in a plasma processing chamber including a plasma torch 600. A controlled flow of precursor is placed in a central channel of the plasma torch 602. A plasma gas is introduced through an outer tube 604, and an auxiliary gas is introduced through an intermediate tube of the plasma torch 606. The gases can be introduced relatively simultaneously. Energy is coupled to the plasma discharge in an annular region of the plasma torch 608. At least one of the workpiece and the plasma torch is translated and/or rotated, such as by translating the workpiece with respect to the torch 610. Reactive atom plasma processing is then used to shape the surface of the workpiece with the discharge from the plasma torch 612.

Chemistry

A reactive atom plasma process in accordance with the present invention is based, at least in part, on the reactive chemistry of atomic radicals formed by the interaction of a non-reactive precursor chemical with a plasma. In one such process, the atomic radicals formed by the decomposition of a non-reactive precursor interact with material on the surface of the part being shaped. The surface material is transformed to a gaseous reaction product and leaves the surface. A variety of materials can be processed using different chemical precursors and different plasma compositions. The products of the surface reaction in this process must be a gas under the conditions of the plasma exposure for etching to take place. If not, a surface reaction residue will build up on the surface which will impede further etching.

In one process in accordance with the present invention, the chemistry is specific to fluorine and materials that react with fluorine to form gaseous products. Following are three specific examples where weight loss was measured. The materials processed include:

Silicon dioxide (fused quartz) where the balanced reaction of concern is

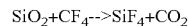
$$SiO_2 + CF_4 \rightarrow SiF_4 + CO_2$$

Silicon carbide works with or without the addition of $O_2$. The use of $O_2$ can greatly speed the operation. One such balanced equation is given by:

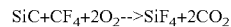
$$SiC + CF_4 + 2O_2 \rightarrow SiF_4 + 2CO_2$$

Silicon works with or without addition of oxygen to the plasma. Oxygen can also be supplied by the ambient air. A balanced equation that can be used with the process is given by:

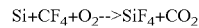
$$Si + CF_4 + O_2 \rightarrow SiF_4 + CO_2$$

The reaction may also work with $CF_4$ supplied by the device and ambient oxygen in the tool enclosure.

Other fluorocarbons and molecules containing fluorine can work as well. SF6 has been used as the chemical precursor to successfully etch silica glass. The equation can be the same as for $CF_4$, such as may be given by:

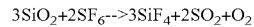
$$3SiO_2 + 2SF_6 \rightarrow 3SiF_4 + 2SO_2 + O_2$$

or

$$3SiO_2 + 2SF_6 \rightarrow 3SiF_4 + 2SO_3$$

In addition to $SF_6$, a large number of fluorine-containing chemicals may be suitable for use as reactive precursors. For example, chemicals of the type $C_nF_{2n+2}$ such as $C_2F_6$, $C_3F_8$, and $C_4F10$ can be used. Fluorine chemicals with other cations may also be suitable, as well as $F_2$. For work on materials that do not contain silicon, such as, but not limited to, oxides, metals, carbides, and organic materials, a different reactive atomic species may be appropriate, such as chlorine or bromine. Compounds containing these elements may also be suitable as reactive precursors. An example of such a suitable class of chemicals would be the class of halocarbons. Mixtures of more than one reactive precursor can also be used. Specific examples of other chemicals that may be useful include $CHF_3$, $CCl_2F_2$, $Cl_2$, $F_2$, $HCl$, $CH_4$, $H_2$, $SF_6$, and NFx (where x is any number that balances), as well as any mixtures of these chemicals in argon and/or other noble gases.

In the above examples, the reactive precursor chemical can be introduced as a gas. Such a reactive precursor could also be introduced to the plasma in either liquid or solid form. Liquids can be aspirated into the plasma and fine powders can be nebulized by mixing with a gas before introduction to the plasma. In fact, an aqueous solution of HF can be particularly effective because it supplies both fluorine for etching and oxygen for carbon removal, if needed. The equations for such a process may be given by:

or

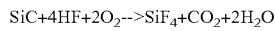

Such a process has several advantages over the RIE process. RIE requires a vacuum, whereas RAP processing can be used at atmospheric pressure. RAP has much higher material removal rates and can be used as a sub-aperture tool to precisely shape surfaces, whereas RIE is best suited to remove small quantities of material across an entire surface. Finally, RIE cannot smooth rough surfaces whereas RAP processing rapidly polishes and etches surfaces.

ICP Plasma Torch

An inductively-coupled plasma (ICP) is an excellent source of reactive atoms useful for shaping damage free surfaces. An ICP discharge has previously been used to produce crystalline films of a number of oxides, such as MgO, $ZrO_2$, NiO, $SnO_2$, $TiO_2$, $ZnCr_2O_4$, $Cr_2O_3$, $CoCr_2O_4$, $NiCr_2O_4$, and several rare earth oxides. Superconducting thin films of Bi—Pb—Sr—Ca—Cu—O have also been fabricated with ICP plasma spray methods.

The high electrical conductivity of partially ionized gases (for example 120 ohm/$cm^{-1}$ at 15,000 K for argon) may contribute to the ease of inductively coupled plasma formation at high pressures. ICP systems do not require electrodes. A number of gases can be used as the host plasma, though argon may be the principle component. A typical discharge can be characterized by a high current (such as 100 to 1000 amps) and a relatively low voltage (such as 10 to 100 volts). The flowing plasma is not in complete thermodynamic equilibrium, but ion and excited state atom populations can be within 10% of equilibrium values. Electron densities can be high, typically above $10^{15}$ $cm^{-3}$, which suggests electron temperatures above 15,000K. A peak temperature of 10,000K can be calculated from the ratio of emission intensities for a set of argon lines (again assuming equilibrium) and gas kinetic temperatures have been estimated to be roughly 6,000K. These high temperatures make the ICP an efficient source for the generation of reactive atoms.

Figure 3:
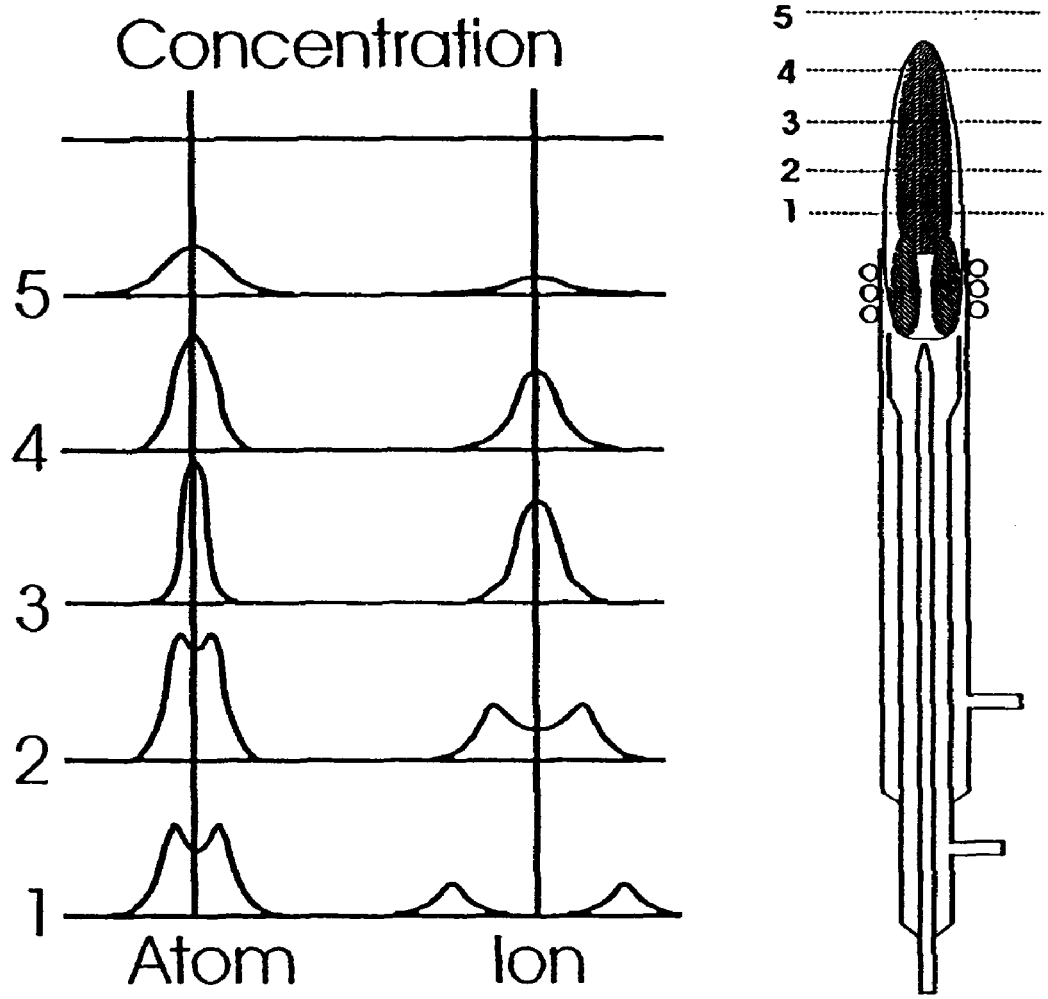
FIG. 3 is a diagram showing relative concentrations of reactive atoms and reactive ions in a plasma discharge that can be used in accordance with one embodiment of the present invention.

The current from a 27.12 MHz RF generator flows through a three-turn copper load coil around the top of the torch, such as the one shown in FIG. 2. The energy is coupled into the plasma through an annular "skin region" that is located on the outer edge of the plasma nearest the load coil. The plasma can be supported in a quartz tube by the plasma gas, which can be introduced tangentially to form a stabilizing vortex. The "skin region" is thinnest along the central axis and the droplets or gas easily penetrate the discharge. As the droplets travel through the plasma they becomes progressively desolvated, atomized, excited, and ionized. The relative distribution of ions and atoms in the discharge is represented in FIG. 3. Spatial profiles at five places in the plasma indicate that the excited ion population decays faster than that of the neutral atoms, most likely a result of ion-electron recombination. The maximum atomic emission from the material injected into the plasma occurs several millimeters above the load coil near the visible tip of the discharge (zone 3 and 4). Radiative decay in this region is used to spectroscopically determine the composition of the injected material.

A standard, commercially available three-tube torch can be used, such as one having three concentric tubes as discussed above. The outer tube can handle the bulk of the plasma gas, while the inner tube can be used to inject the reactive precursor. Energy can be coupled into the discharge in an annular region inside the torch. As a result of this coupling zone and the ensuing temperature gradient, a simple way to introduce the reactive gas, or a material to be deposited, is through the center. The reactive gas can also be mixed with the plasma gas, although the quartz tube can erode under this configuration.

Injecting the reactive precursor into the center of the excitation zone has several important advantages over other techniques. Some atmospheric plasma jet systems, such as ADP, mix the precursor gas in with the plasma gas, creating a uniform plume of reactive species. This exposes the electrodes or plasma tubes to the reactive species, leading to erosion and contamination of the plasma. In some configurations of PACE, the reactive precursor is introduced around the edge of the excitation zone, which also leads to direct exposure of the electrodes and plasma contamination. In contrast, the reactive species in the RAP system are enveloped by a sheath of argon, which not only reduces the plasma torch erosion but also reduces interactions between the reactive species and the atmosphere.

The second of the three tubes, optional in some embodiments, can be used to introduce an auxiliary gas, such as at a rate of about 1 L/min. The auxiliary gas can have at least two functions. First, the gas can keep the hot plasma away from the inner tube, since even brief contact may seal the inner tube shut. Second, the gas can be used to adjust the position of the discharge in space.

The inner diameter of the outer tube can be used to control the size of the discharge. On a standard torch, this can be on the order of about 18 mm. In an attempt to shrink such a system, torches of a two tube design can be constructed, which can have an inner diameter of, for example, about 6 mm, although larger or smaller inner diameters may be appropriate.

The outer tube gas, such as a plasma gas, can be introduced tangentially and can stabilize the discharge. The tangential introduction can also be maintained with no auxiliary tube. A de-mountable system can be used, where the tubes are individually held and separately replaced. An advantage to such a system is that the length of the outer tube can be lengthened, allowing the plasma to cool down while preventing reactive radical atoms from reacting with air.

A small torch erosion problem may exist due to a minor portion of the precursor not entering the central zone but instead going around the outside of the plasma. An increase in skin depth (i.e. a thicker energy coupling zone) can constrict the central channel, possibly restricting the precursor flow and allowing some to escape to the periphery. One of the advantages of systems in accordance with the present invention is that there is little to no electrode or nozzle erosion.

Housing

As shown in FIG. 1, there are several basic blocks to a system in accordance with the present invention. A plasma box can be used to house the ICP torch. The plasma box can be used, for example, to shield an operator from radio frequency energy generated during a process, and/or from UV light produced by a plasma. The plasma box can be kept under a slight negative pressure, such as by hooking it up to a chemical hood exhaust system. The entire enclosure can be constructed, for example, from a single sheet of copper that has been folded, rather than connected from individual plates.

One of the characteristics of RF is that it travels along a surface of a metal rather than through a metal. RF tends to find and leak out of seams and around doorframes. Since it may not be possible to completely avoid edges, the edges of the box can be filled with, for example, silver solder and ground with a radius on them, so that there are no sharp points or edges. Pieces that move, such as doors, can be bolted tight, such as through the use of fasteners.

Holes and windows can be formed or cut into the box, such as to allow for air to enter the plasma and sample box, as well as to allow access for servicing, and to provide a place for visual inspection of the system while operating. Since RF cannot escape from holes much smaller than the wavelength of the radiation (for 13.56 MHz the wavelength in vacuum is about 23 meters), a 100 mm square window can have very little leakage. The windows can use welder's glass, for example, and the service holes can be covered with copper tape or other UV-filtering material.

An aluminum sample box can be used to contain the workpiece and translation stages. Aluminum plates can be bolted together to form such a box. It may be unnecessary to use copper, as there may be no need to shield from RF. The sample box can be connected directly to an adjoining torch box, such as through a circular hole. There can also be a window to allow an operator of the system to watch the part during the process, as well as ventilation openings if necessary. A main exhaust system can be connected to the top of the chamber, although other designs may have the exhaust hose or the stage in a different location, such as may minimize turbulence around the part. There can also be a gauge to measure the pressure differential between the room and the inside of the chamber.

The main components inside a sample chamber in accordance with the present invention, with the exception of the sample, are the translation stages and the chuck. The chuck can be a relatively simple vacuum system, which can be mounted to the rotary stage and connected to a pump, such as a carbon vane pump, through a rotary or other appropriate connection. The chuck can be smaller than, or equal in size to, the size of the part. If the chuck protrudes past the part, a small amount of chuck material may deposit on the edge or surface.

Gas Flow Control

Devices such as rotometers and mass flow controllers can be used to meter gas flow. A system can, for example, use mass flow controllers with piezoelectric transducers to monitor gas flow on all lines except the auxiliary. A power source and control panel can be rack mounted. This can be a commercial unit useful for low-pressure capacitively coupled discharges. The rack can also contain the stage controller and the electronics for the mass flow controllers.

The introduction of reactive gas into the plasma can be controlled by a mass flow controller over a range, for example, of 2000 ml of $CF_4$ per minute to 0.05 ml per minute, with an accuracy that may be in the range of +/−2.0%. With such a system, it may be possible to go from, for example, 40 L/min of $CF_4$ (by using $CF_4$ in the main body of the plasma) to 0.01 ml/min (using dilution).

There can be several mass flow controllers controlling gas introduction. Having several controllers in series and/or parallel with flow ranges such as from 10 L/min to 0.1 L/min can provide a great deal of flexibility, and allows for complex chemistries of reactive precursor gases. In one example, 1 ml/min of $CF_4$ is introduced into the central channel using such a system.

The main gas flow, such as may contain a plasma gas, can serve to supply the discharge with a flowing stream of, for example, argon. The flow rate can be changed over a fairly wide range, such as from zero to about 40 L/min. If the flow is too fast, the plasma may "blow out." A large flow rate can result in a dilution of both the reactive gas and of the energy put into the system.

RF Power Supply and Control

A wide range of power conditions can be used when operating a system in accordance with the present invention. Standard RF units operate at 13.56 MHz, 27.12 MHz, or 40.68 MHz. The frequencies are presently set by the FCC, and may not affect the performance of atomization but may affect the skin depth of the plasma. While a standard RF unit can have a maximum power of 5 to 10 kW, many applications may never require power above 2.5 kW.

At certain reactive gas flow rates, the additional power may do nothing but deposit more heat on the part. Surface heating on the part can be important to reaction rates and reaction efficiency. Generally, the rates increase with temperature. It may be undesirable to greatly increase the temperature of the part, as reaction products can be produced that condense on cooler areas of the part and on the housing of the device. Too much heat can also cause thermal stress in the part, as well as a change in shape due to thermal expansion. The additional energy at the high power settings can also serve to reduce the number of active species, such as by converting the reactive atoms to ions and reduce their reactivity.

In one system in accordance with the present invention, the process must produce a volatile reaction product to be successful. The plasma temperature can be between 5,000 and 15,000° C. As the plasma can be a non-equilibrium system, different techniques for estimating temperature can yield different results. The lower value, 5,000° C., is the gas kinetic temperature and may bear the largest responsibility for heating the part.

The entire system can be mounted on an optical table, or any other appropriate mounting surface or structure. Since the removal tool is a gaseous flow of reactive atoms, it may not be very vibration sensitive. To eliminate any environmental contribution, a clean room or other appropriate enclosure can be built around the sample chamber and torch box.

Dynamic Range

One advantage of a system in accordance with the present invention is the dynamic range of material removal. At a low setting, the reactive gas can be delivered in such minute quantities that single atomic layers are removed, such as over a period of seconds or even minutes. At higher settings, the process can remove at least grams of material per minute. While they might not be practical for material removal, very low etch rates can be important for modifying the surface of materials treated with the plasma.

By using a range of mass flow controllers and using precursor gas in 100%, 10% and 1% mixtures with argon, a dynamic range of five orders of magnitude in etch rate is available in one embodiment, although additional orders of magnitude in etch rate are possible using different ranges and mixtures. At a high end, such as may be achieved by confining a precursor to the central channel, it is possible to introduce 1000 ml/min of 100% $CF_4$. On a low end, a 1% mix of $CF_4$ in argon can be delivered to a central channel with a flow rate of 1 ml/min. Etch rates can be reduced by two more orders of magnitude such as by using a flow controller that operates, for example, from 0 to 10 ml/min and/or by a further 1 OX or other appropriate dilution of the gas.

Precision Shaping

Figure 4:
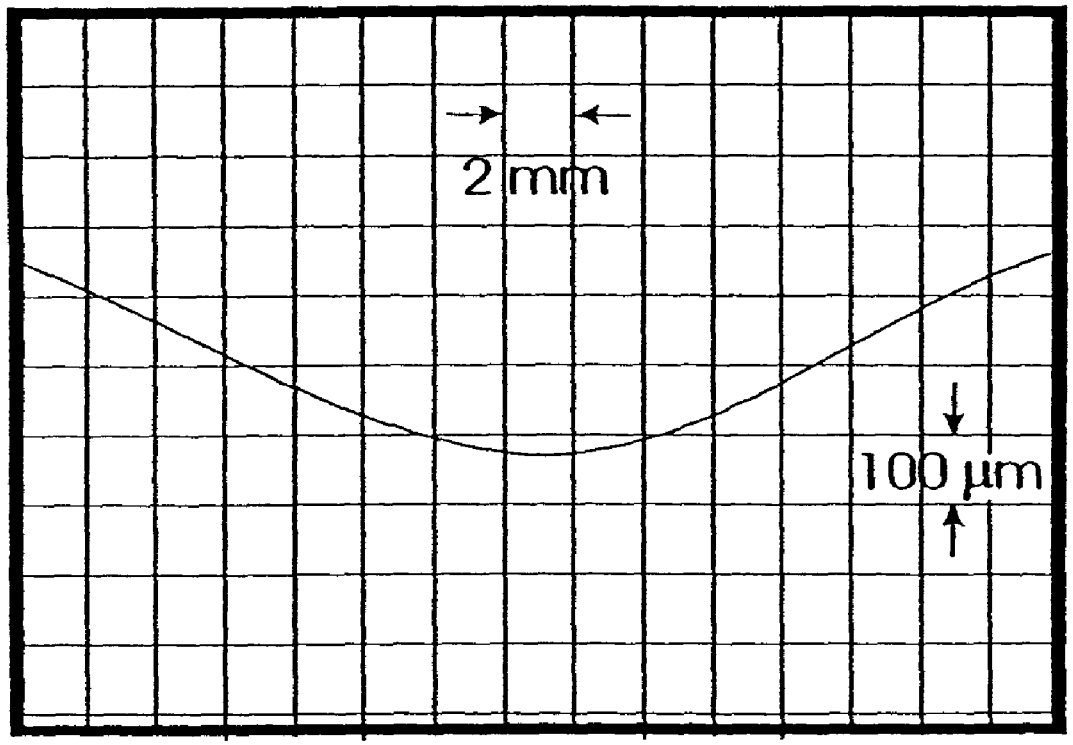
FIG. 4 is a graph of a footprint of a tool that may be used in accordance with one embodiment of the present invention.

Using conditions such as those described above, it is possible to get a stable, predictable, reproducible distribution of reactive species that is roughly Gaussian in nature, although other distributions are possible and may be appropriate for certain applications. For many applications, it may only be desirable that the distribution be radially symmetric. For example, a 18 mm inner diameter torch may have a spread of about 30 mm. FIG. 4 is a probe trace of a pit produced by a 1.5 kW plasma with a reactive gas flow rate of 50 mls/minute over a 5 minute period. The distance from the load coils (energy induction zone) to the part surface was 25 mm. As the exposure time is increased or decreased, such a hole can get deeper or shallower, but its width may not vary greatly. Therefore, the tool shape produced by the plasma system can be extremely shallow and broad, which can relax the requirements for precision X-Y positioning of the tool or the part.

An important factor in this process is the fact that the footprint of the plasma discharge can be stable and reproducible, and dependant on controllable parameters. Fairly similar etch rates can be produced if similar systems are run under identical conditions, and the same system can be highly reproducible from day to day. For extremely precise surfaces, the footprint of the tool may need to be measured before each removal step. It may also be possible, however, to determine the footprint as a byproduct of the iterative shaping process.

If any shape on the part is required, other than a Gaussian depression of various depths, it may be necessary to translate and/or rotate the part relative to the torch, although it may also be possible to translate and/or rotate the torch with respect to the part, or both with respect to each other. If the torch is held stationary and lowered into the part a depression or pit may result. If the torch translates across the part while spinning, a trench may be produced. The floor of the trench can take on the characteristics of the distribution of reactive species in the torch, and also can be determined by how closely the torch paths approach each other on subsequent passes. It may be necessary to move two stages at the same time. To accomplish this, a second controller can be used, such as may be computer- or machine-controlled. A basic system can be limited to a constant rotation speed, with the translation speed across the part being controlled in a stepwise fashion (i.e. go a certain distance at a fixed speed and at a certain point change the speed).

In such a process, a rough part can be measured for which a fairly accurate estimate of the footprint is known, such as from previous experiments. The final desired part shape may be known, and a pathway for the tool can be calculated to get the final shape from all of the input variables, including such input variables as initial part shape, plasma conditions, dwell time, and removal behavior of the workpiece material. When completed, the part shape could be accurately measured and compared with the desired shape. The difference may be the error in the assumption of the footprint shape.

To produce an approximation to complex (or flat) surfaces with such a system, the part can be rotated as it is translated in front of the discharge. For uniform material removal in certain applications, the speed of the torch across the surface may need to be constant. For some applications it may be necessary to vary all parameters simultaneously including tool position, part position, gas flow rate, gas flow composition and excitation energy.

Rapid Polishing of Rough Surfaces

One of the more surprising and interesting features of systems in accordance with the present invention is the planarization and/or polishing of rough surfaces. Parameters which can dictate the time required to polish glass or other suitable materials with the plasma system include the concentration of species in the plasma gas (both reactants and products) and the temperature of the surface and surrounding gas. Exchange of species on and off the surface, as well as the local redeposition of material during etching, can be principally responsible for the rapid smoothing of rough surfaces, resulting in planarization on at least a local scale.

The relatively high concentration of species in the plasma, and the local equilibrium established across the boundary layer by this process, can explain why other lower pressure plasma systems such as PACE do not exhibit such a smoothing effect. The higher-pressure gas can reduce the mean free path of the products, keeping the products in the surface region for a greater amount of time. In addition, the higher-pressure gas can have a greater heat capacity, keeping the near surface region of the solid at a higher temperature. While low-pressure plasma temperatures may be the same, the actual amount of heat deposited on the surface using an atmospheric pressure plasma system can be greater due to the higher flux of gas. This is evident in the fact that one system in accordance with the present invention uses a 1.5 to 2.25 kW plasma while the PACE and microwave devices commonly run at a few hundred watts in a maximum configuration.

Another way to change the amount of material available for deposition, and to affect the rate of planarization or smoothing, is to add a reactant into the plasma that would cause deposition while the fluorine atoms cause etching. A combination of some volatile silicon compound with the addition of oxygen may be sufficient.

An equilibrium-deposition state in accordance with the present invention is not the same as previous plasma deposition, as the process does not simply fill in holes but rather involves a local redistribution of material at the surface. This may be important for applications where it is necessary that the structure of the final surface material be nearly identical to the bulk phase.

Deposition

A process in accordance with the present invention can use a plasma to put down a coating. The plasma can also be used to subtly alter the chemistry of the surface. A slight addition of, for example, oxygen in the plasma at the beginning of the process can clean all organic material from the surface. Reactive surfaces can be created for enhanced bonding of subsequent layers or capped to prevent corrosion. Alternatively, a controlled and limited production of surface oxide can be put down as a passivation layer.

Shaping and Smoothing Heterogeneous Materials

In one application of the present invention, a heterogeneous material can be etched using the plasma. The resulting surface may not be smooth due to variable etch rates between heterogeneous grains, as well as preferential etching along grain boundaries. However, the chemistry in the plasma can be altered to favor deposition over removal, and a layer of the same material, or a different material can be quickly deposited. A suitable reactive chemical precursor is required. For example, for the deposition of amorphous $SiO_2$, a range of chemical compounds containing silicon may be suitable that includes, but is not limited to, silanes. For the deposition of other materials, different chemicals can be required. Such a chemical precursor can be introduced in wither the solid, liquid, or gas form. Liquids can be aspirated into the plasma and powders of solids can be nebulized and introduced with a gas.

This new layer may be more amenable to the smoothing process. Back-etching of this redeposited layer can allow the shaping of smooth surfaces on an originally rough and heterogeneous substrate. Alternatively, wet chemical etching can be used to remove surface damage on a conventionally polished part. The resulting rough surface then could be coating using the plasma jet and back-etched to achieve a smooth precise surface.

A material that may be important for this type of procedure is Zerodur. Zerodur is a low expansion composite material used in the fabrication of large optics. Over a narrow range of temperature, one of the ingredients has a positive coefficient of expansion while the other has the opposite response, resulting in near-zero thermal expansion of the bulk material. While polishing to an optical finish using an embodiment detailed herein may be difficult on such a composite material, it may be possible to use the plasma to shape the material to within 10-100 Mn. Next, a layer of amorphous SiO2 can be added and then back-etched to final shape.

The foregoing description of preferred embodiments of the present invention has been provided for the purposes of illustration and description. It is not intended to be exhaustive or to limit the invention to the precise forms disclosed. Many modifications and variations will be apparent to one of ordinary skill in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A method for shaping a surface of a workpiece, comprising:
    positioning at least one of a workpiece and an inductively-coupled plasma (ICP) torch including three concentrically arranged tubes;
    introducing a plasma gas to an outer tube of the ICP torch;
    transferring energy from a radio frequency (RF) power source to the plasma gas to generate an excitation zone at least partially downstream of the ICP torch;
    introducing a reactive precursor to the excitation zone;
    introducing an auxiliary gas to an intermediate tube to control a position of the excitation zone relative to the ICP torch so that a controlled distribution of reactive species is formed;
    removing material from the surface of the workpiece with at least a portion of the reactive species; and
    adding material to the surface of the workpiece with at least a portion of the reactive species.

2. A method according to claim 1, further comprising:
    altering the chemistry of the surface of the workpiece with at least a portion of the reactive species.

3. A method according to claim 1, wherein the removing and adding steps causes minimal or no damage to the workpiece underneath the surface.

4. A method according to claim 1, further comprising:
    rotating the workpiece with respect to the plasma torch.

5. A method according to claim 1, further comprising:
    controlling the mass flow of a precursor into the plasma from between about 0 ml/min to about 2,000 ml/min.

6. A method according to claim 1, further comprising:
    controlling the mass flow of the reactive precursor into the plasma from between about 0 ml/min to about 50,000 ml/min.

7. A method according to claim 1, further comprising:
    coupling energy to the excitation zone in an annular region of the plasma torch.

8. A method according to claim 1, further comprising:
    using the auxiliary gas to keep hot plasma away from a central channel of the plasma torch.

9. A method according to claim 1, further comprising:
    introducing the plasma gas to the outer tube tangentially.

10. A method according to claim 1, further comprising:
    maintaining the temperature of the plasma between 5,000 and 15,000 degrees C.

11. A method according to claim 1, further comprising:
    producing a volatile reaction on the surface of the workpiece.

12. A method according to claim 1, further comprising maintaining the ICP torch and the workpiece at about atmospheric pressure.

13. A method according to claim 1, further comprising:
    using the reactive precursor to control the etch rate of the plasma, the reactive precursor being any one of a solid, liquid, or gas.

14. A method for cleaning a surface, comprising:
    positioning at least one of a workpiece and an inductively-coupled plasma (ICP) torch including three concentrically arranged tubes;
    introducing a plasma gas to an outer tube of the ICP torch;
    transferring energy from a radio frequency (RF) power source to the plasma gas to generate an excitation zone at least partially downstream of the ICP torch;
    introducing a reactive precursor to the excitation zone;
    introducing an auxiliary gas to an intermediate tube to control a position of the excitation zone relative to the ICP torch so that a controlled distribution of reactive species is formed;
    depositing material to the surface of the workpiece with at least a portion of the reactive species; and
    removing material from the surface of the workpiece with at least a portion of the reactive species.

15. A method for redistributing a material on a surface, comprising:
    positioning at least one of a workpiece and an inductively-coupled plasma (ICP) torch including three concentrically arranged tubes;
    introducing a plasma gas to an outer tube of the ICP torch;
    transferring energy from a radio frequency (RF) power source to the plasma gas to generate an excitation zone at least partially downstream of the ICP torch;
    introducing a reactive precursor to the excitation zone;
    introducing an auxiliary gas to an intermediate tube to control a position of the excitation zone relative to the ICP torch so that a controlled distribution of reactive species is formed;
    depositing material to the surface of the workpiece with at least a portion of the reactive species; and
    redistributing material from the surface of the workpiece with at least a portion of the reactive species.

* * * * *